(12) United States Patent
Ahn

(10) Patent No.: US 9,214,470 B2
(45) Date of Patent: Dec. 15, 2015

(54) NON-VOLATILE MEMORY DEVICE WITH VERTICAL MEMORY CELLS AND METHOD FOR FABRICATING THE SAME

(71) Applicant: SK hynix Inc., Gyeonggi-do (KR)

(72) Inventor: Jung-Ryul Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 60 days.

(21) Appl. No.: 14/311,003

(22) Filed: Jun. 20, 2014

(65) Prior Publication Data

US 2014/0302655 A1    Oct. 9, 2014

Related U.S. Application Data

(62) Division of application No. 13/333,893, filed on Dec. 21, 2011, now Pat. No. 8,759,902.

(30) Foreign Application Priority Data

Aug. 23, 2011 (KR) ........................ 10-2011-0084122

(51) Int. Cl.
*H01L 21/8238* (2006.01)
*H01L 27/115* (2006.01)
*H01L 29/66* (2006.01)
*H01L 29/792* (2006.01)
*H01L 21/28* (2006.01)

(52) U.S. Cl.
CPC .... *H01L 27/11578* (2013.01); *H01L 27/11582* (2013.01); *H01L 29/66833* (2013.01); *H01L 29/792* (2013.01); *H01L 29/7926* (2013.01); *H01L 21/28282* (2013.01); *H01L 27/115* (2013.01); *H01L 27/11568* (2013.01)

(58) Field of Classification Search
CPC .................................................. H01L 27/11578
USPC .......................................... 257/324; 438/216
See application file for complete search history.

(56) References Cited

U.S. PATENT DOCUMENTS

2010/0155818 A1\* 6/2010 Cho .................. H01L 27/11578
257/324
2010/0258852 A1\* 10/2010 Lim .................. H01L 27/11551
257/324

\* cited by examiner

*Primary Examiner* — Anthony Ho
(74) *Attorney, Agent, or Firm* — IP & T Group LLP

(57) ABSTRACT

A non-volatile memory device includes a plurality of gate electrodes stacked over a semiconductor substrate and stretched in a first direction along the semiconductor substrate and a plurality of junction layers having a first region protruding from the semiconductor substrate and crossing the gate electrodes and a second region formed between the gate electrodes.

8 Claims, 22 Drawing Sheets

NON-VOLATILE MEMORY DEVICE WITH VERTICAL MEMORY CELLS AND METHOD FOR FABRICATING THE SAME

CROSS-REFERENCE TO RELATED APPLICATIONS

This application is a division of U.S. patent application Ser. No. 13/333,893 filed on Dec. 21, 2011, which claims priority of Korean Patent Application No. 10-2011-0084122, filed on Aug. 23, 2011. The disclosure of each of the foregoing application is incorporated herein by reference in its entirety.

BACKGROUND

1. Field

Exemplary embodiments of the present invention relate to a semiconductor device and a fabrication method thereof, and more particularly, to a non-volatile memory device and a fabrication method thereof.

2. Description of the Related Art

When a single layer of memory cells are formed over a monocrystalline silicon substrate, a memory density thereof is determined based on patterning limitation and packaging limitation. The packaging limitation may be relaxed by decreasing the size of patterns so as to increase the memory density.

However, as patterning technology reaches the technical limitation, it is difficult to further increase the memory density. In such circumstances that there are increased demands for the increase in the memory density, forming a single layer of memory cells over a monocrystalline silicon substrate may not satisfy the demands. Here, the memory density signifies the number of memory cells formed in a unit area.

SUMMARY

An embodiment of the present invention is directed to a non-volatile memory device that may include more memory cells than a conventional non-volatile memory device regardless of the area of a substrate, and a method for fabricating the non-volatile memory device.

In accordance with an embodiment of the present invention, a non-volatile memory device includes: a plurality of gate electrodes stacked over a semiconductor substrate and stretched in a first direction along the semiconductor substrate; and a plurality of junction layers having a first region protruding from the semiconductor substrate and crossing the gate electrodes and a second region formed between the gate electrodes.

In accordance with another embodiment of the present invention, a non-volatile memory device includes: a plurality of cell channel layers and a plurality of gate electrodes that are alternately stacked over a semiconductor substrate and stretched in a first direction along the semiconductor substrate; and a plurality of junction layers protruding from the semiconductor substrate, crossing the gate electrodes, and coupled with the cell channel layers.

In accordance with yet another embodiment of the present invention, a method for fabricating a non-volatile memory device includes: forming a stack layer by alternately stacking a first conductive layer, a first insulation layer, and a second insulation layer over a semiconductor substrate; forming first openings and a plurality of gate electrodes that are isolated from each other by the first openings by etching the stack layer; forming a third insulation layer filling the first openings; forming second openings by selectively etching the third insulation layer; forming third openings by removing the second insulation layer that is exposed on sidewalls of the second openings; forming a charge trapping dielectric layer over the semiconductor substrate having the third openings formed therein; and forming a junction layer and a cell channel layer over the charge trapping dielectric layer to fill the second openings and the third openings, respectively.

DETAILED DESCRIPTION

Figure 1:
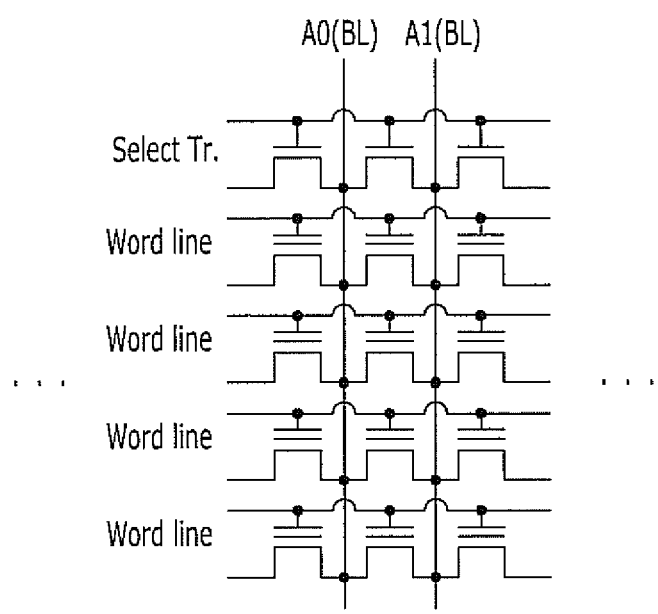
FIG. 1 is an equivalent circuit diagram of a non-volatile memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to an embodiment of the present invention, memory cells are formed in a multi-layer structure by stacking memory cells in a direction perpendicular to a silicon substrate.

The following embodiment provides a flash memory device, in particular, an ORNAND-type flash memory device. The ORNAND-type flash memory device may also be referred to as NROM.

FIG. 1 is an equivalent circuit diagram of a non-volatile memory device in accordance with a first embodiment of the present invention. To be specific, FIG. 1 shows an ORNAND-type flash memory device.

Referring to FIG. 1, each memory cell is coupled with a word line that functions as a control gate in a memory cell array, and a pair of memory cells shares a common bit line A0 or A1. For example, the memory cell array in the embodiment is coupled with a selection transistor (Tr).

Depending on how memory cells are coupled with bit lines in response to a word line voltage, the memory cells may write, read, and erase bits of data. Reading a first bit of the data, for example, 'A' bit of a memory cell, is carried out by applying the word line voltage and coupling a drain and a source of the memory cell with a bit line A1 and a bit line A0, respectively. Similarly, reading a second bit of the data, for example, 'B' bit of a memory cell, is carried out by coupling a drain with a bit line A0 and coupling a source with a bit line A1. The multi-bits of the data may be stored by a charge trapping dielectric layer disposed between a bit line and a word line. The charge trapping dielectric layer includes multiple dielectric layers, for example, oxide layers, and a charge trapping layer, for example, a nitride layer, interposed between the multiple dielectric layers. Since the charge trapping dielectric layer has the stacked structure, the charge trapping dielectric layer is referred to as an ONO (oxide-nitride-oxide) layer.

Figure 2:
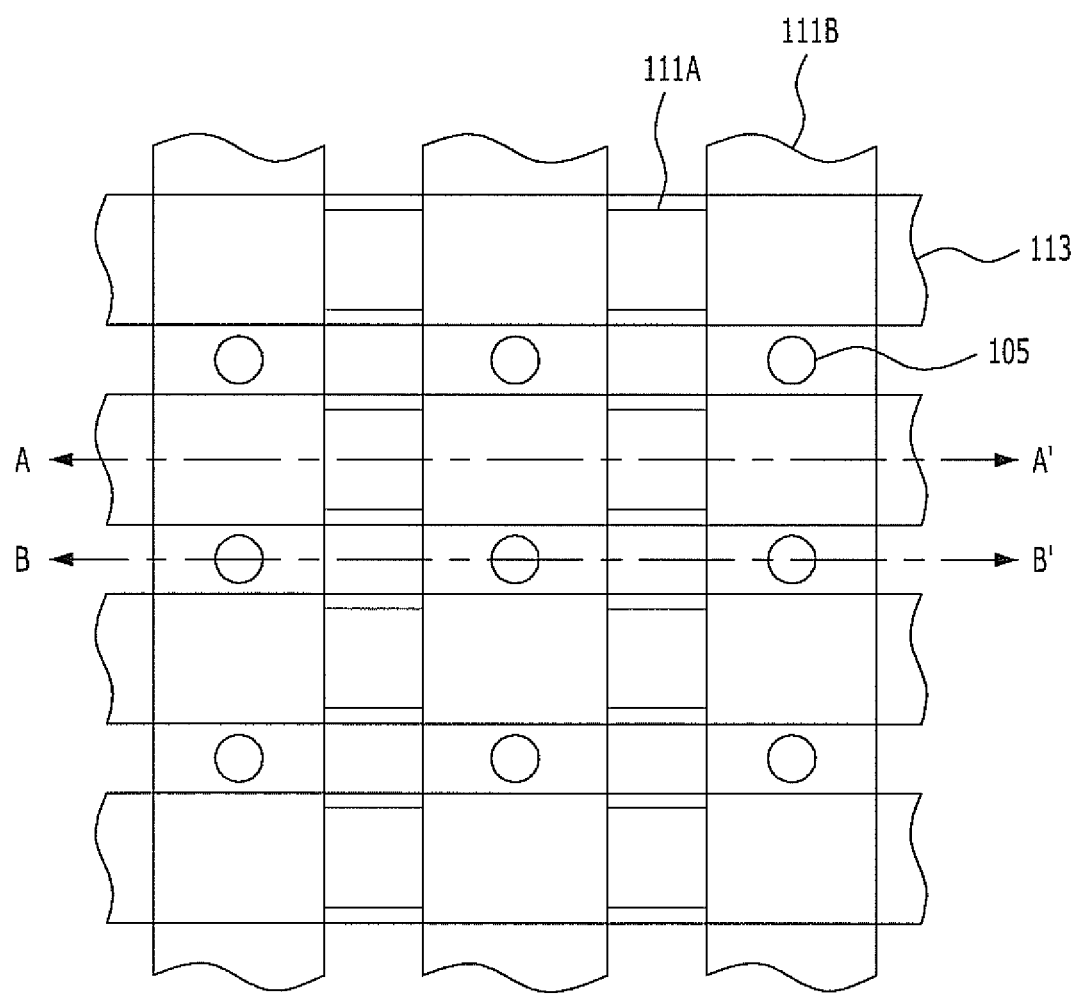
FIG. 2 is a projection view of the non-volatile memory device in accordance with the first embodiment of the present invention.

FIG. 2 is a projection view of the non-volatile memory device in accordance with the first embodiment of the present invention.

Referring to FIG. 2, the non-volatile memory device includes a plurality of gate electrodes that are stretched in a first direction and stacked in a vertical direction from a substrate, junction layers 111A stretched in a second direction crossing the gate electrodes, i.e., protruding in the vertical direction from the substrate, and cell channel layers 111B formed between the stacked gate electrodes. The gate electrodes are stacked vertically over a semiconductor substrate and the plane-shaped cell channel layers 111B are disposed between the gate electrodes. Since the cell channel layers 111B and the gate electrodes are overlapped, the reference numeral of the gate electrodes is omitted. The junction layers 111A have a shape of pillars stretched vertically from the semiconductor substrate and coupled with the cell channel layer 111B. Here, a reference numeral '105' indicates pillars formed between the stacked gate electrodes. The pillars 105 are of a nitride material. One pillar 105 may be formed for one cell channel layer 111B. A selection gate 113 of a selection transistor is formed in a direction crossing the junction layers 111A and the gate electrodes.

FIGS. 3A to 3J are cross-sectional views illustrating a method for fabricating a non-volatile memory device taken along a line A-A' of FIG. 2. FIGS. 4A to 4H are cross-sectional views illustrating a method for fabricating a non-volatile memory device taken along a line B-B' of FIG. 2.

Figure 3A:
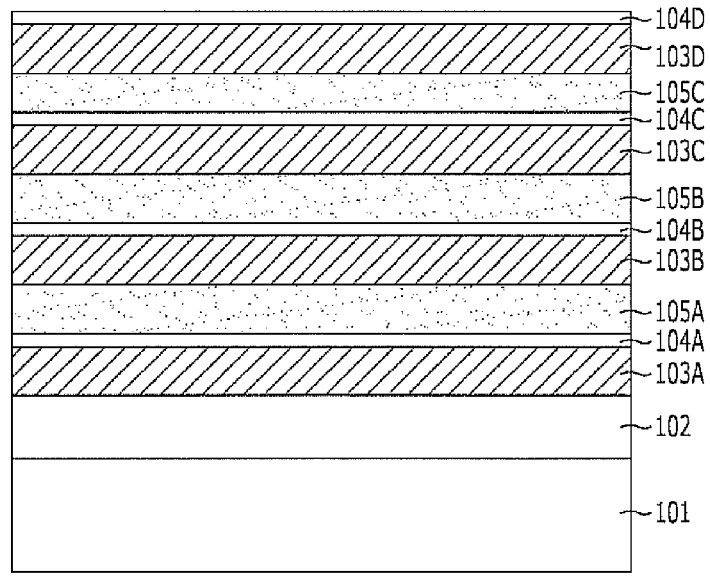
FIGS. 3A to 3J are cross-sectional views illustrating a method for fabricating a non-volatile memory device taken along a line A-A' of FIG. 2.
Figure 4A:
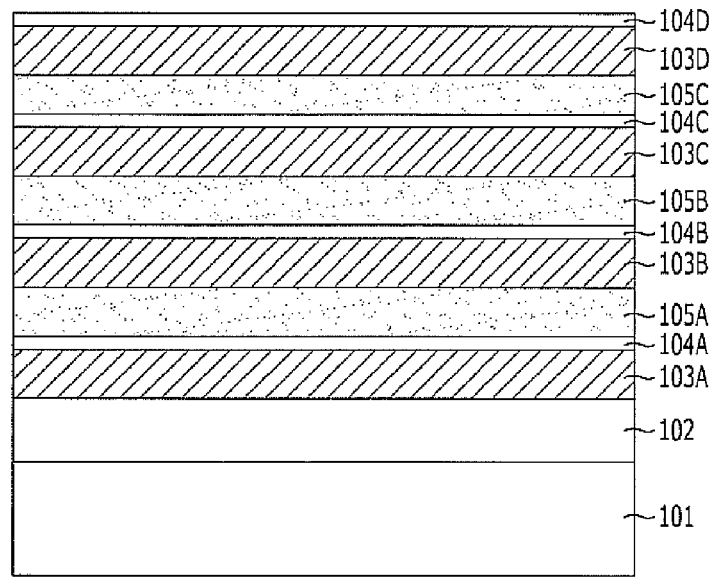
FIGS. 4A to 4H are cross-sectional views illustrating a method for fabricating a non-volatile memory device taken along a line B-B' of FIG. 2.

Referring to FIGS. 3A and 4A, a buffer layer 102 are formed over a semiconductor substrate 101. The semiconductor substrate 101 includes a monocrystalline silicon substrate. The buffer layer 102 may be an oxide layer, such as a silicon oxide layer.

A stack layer is formed over the buffer layer 102. The stack layer is formed by stacking a plurality of insulation layers and a plurality of conductive layers. For example, the stack layer is formed by stacking first conductive layers 103A, 103B, 103C and 103D, first insulation layers 104A, 104B, 104C and 104D, and second insulation layers 105A, 105B and 105C. The first insulation layers 104A, 104B, 104C and 104D include an oxide layer, such as a silicon oxide layer. The second insulation layers 105A, 105B and 105C include a nitride layer, such as a silicon nitride layer. The first conductive layers 103A, 103B, 103C and 103D include a polysilicon layer. When the stack layer is formed by stacking the first conductive layers 103A, 103B, 103C and 103D, the first insulation layers 104A, 104B, 104C and 104D, and the second insulation layers 105A, 1053 and 105C, the lowermost layer may be made by the first conductive layer 103A and the uppermost layer may be made by the first insulation layer 104D.

The first conductive layers 103A, 103B, 103C and 103D function as gate electrodes. In other words, the first conductive layers 103A, 103B, 103C and 103D become control gate electrodes or word lines. The first conductive layers 103A, 103B, 103C and 103D may include metal other than polysilicon or both polysilicon and a metal oxide. Also, the first conductive layers 103A, 103B, 103C and 103D may include a metal compound, such as a metal silicide, e.g., CoSix and NiSix. When the first conductive layers 103A, 103B, 103C and 103D are formed of polysilicon, a metal compound, e.g., CoSix and NiSix, may be further included by forming an opening region through the subsequent process to reduce resistance.

According to an embodiment of the present invention, the first conductive layers 103A, 103B, 103C and 103D, the first insulation layers 104A, 104B, 104C and 104D, and the second insulation layers 105A, 105B and 105C are stacked over the substrate 101 by being disposed alternately. For example, a first conductive layer, a first insulation layer, and a second insulation layer are alternately stacked in the mentioned order in multiple times, while the first insulation layer 104D is disposed as the uppermost layer. In the drawing, the first conductive layers 103A, 103B, 103C and 103D and the first insulation layers 104A, 104B, 104C and 104D are stacked in four times, while the second insulation layers 105A, 105B and 105C are stacked in three times. Since the first conductive layers 103A, 103B, 103C and 103D, the first insulation layers 104A, 104B, 104C and 104D, and the second insulation layers 105A, 105B and 105C are polysilicon layers, oxide layers, and nitride layers, respectively, the stack layer has a stacked structure of polysilicon/oxide/nitride/polysilicon/oxide/nitride/polysilicon/oxide/nitride/polysilicon/oxide. The number of stacking the first conductive layers 103A, 103B, 103C and 103D is the same as the number of memory cells stacked in a line. In short, when the first conductive layers 103A, 103B, 103C and 103D are stacked in four times, the number of memory cells formed in the vertical direction becomes four.

Figure 3B:
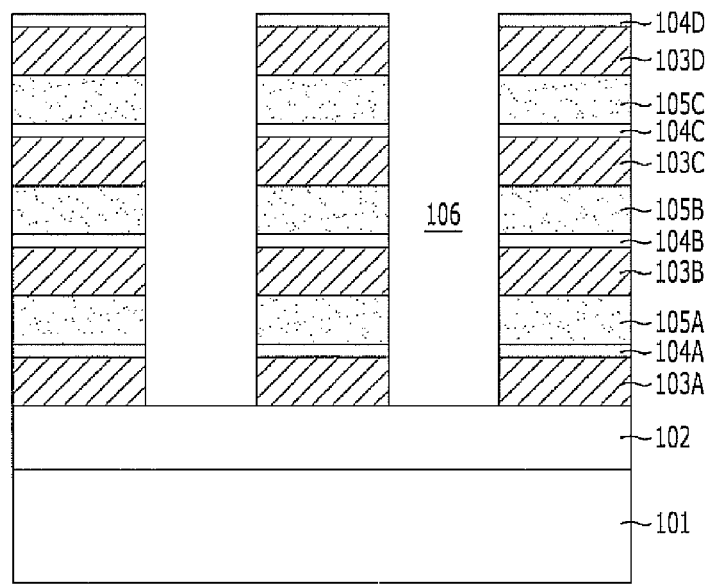
Figure 4B:
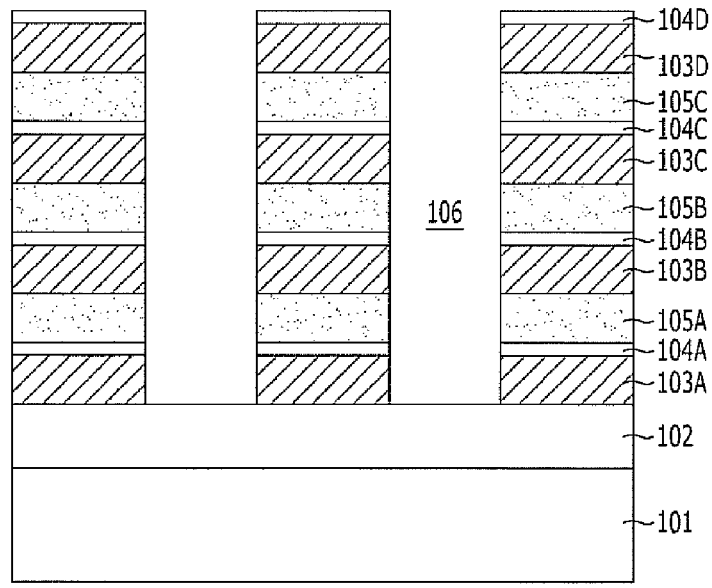

Referring to FIG. 3B and 4B, first openings 106 are formed by selectively etching the stack layer. The first openings 106 are the space for isolating gate electrodes and they have a shape of trench. In short, the first conductive layers become gate electrodes 103A, 103B, 103C and 103D by the first openings 106. The gate electrodes 103A, 103B, 103C and 103D have a shape of lines stretched in a first direction. The four gate electrodes 103A, 103B, 103C and 103D are stacked in the vertical direction by being insulated from each other by the first insulation layers 104A, 104B, 104C and 104D and the second insulation layers 105A, 105B and 105C. The gate electrodes 103A, 103B, 103C and 103D may be also referred to as control gate electrodes or word lines.

Figure 3C:
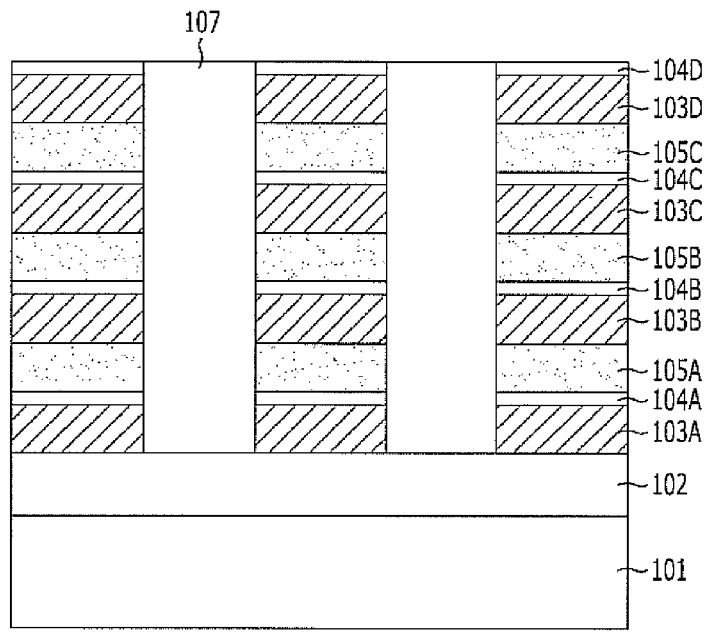
Figure 4C:
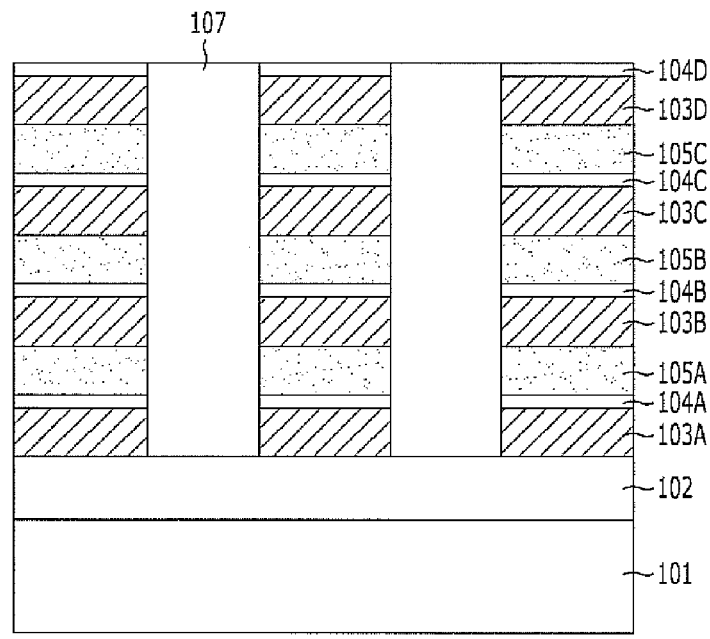

Referring to FIGS. 3C and 4C, a third insulation layer 107 is formed to gap-fill the first openings 106. The third insulation layer 107 insulates neighboring gate electrodes of the same level of the stack layer from each other. The third insulation layer 107 may be formed of an oxide, such as a silicon oxide. The third insulation layer 107 is planarized to expose the upper surface of the stack layer.

Figure 3D:
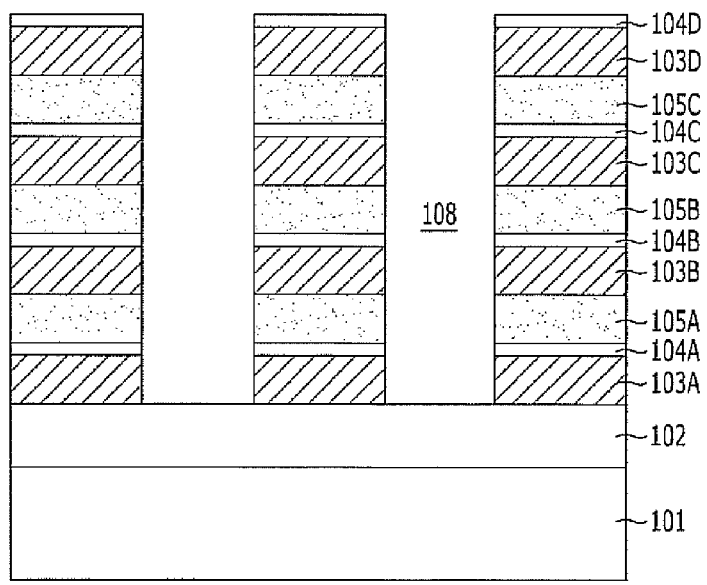
Figure 4D:
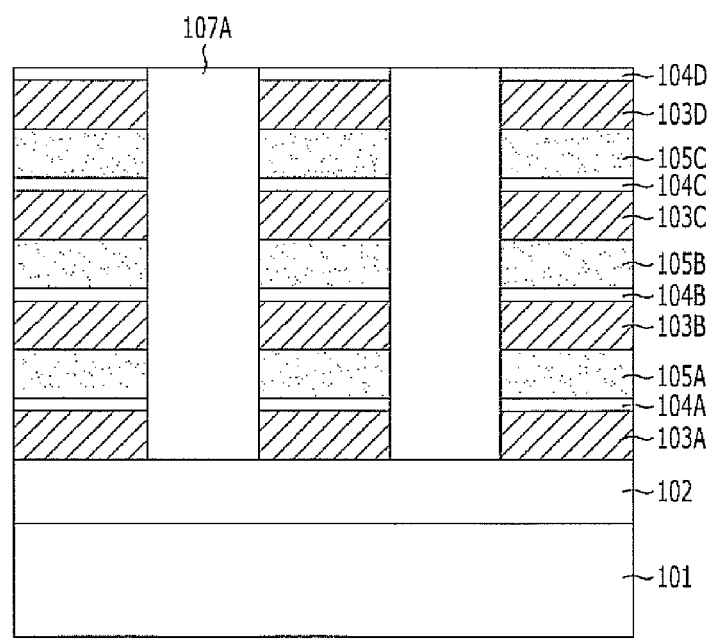

Referring to FIGS. 3D and 4D, second openings 108 are formed by selectively etching the third insulation layer 107. The second openings 108 are the space for a source region and a drain region.

In a plan view, the second openings 108 may have a shape of circular holes or polygonal holes, and the diameter of each opening is formed to be less than approximately 1 μm. Hereafter, the second openings 108 is illustrated to have a rectangular shape according to an example.

A photoresist pattern may be formed as an etch barrier for 1D forming the second openings 108. For example, a photoresist pattern is formed to have a shape of lines stretched in a second direction crossing the first direction of the gate electrodes 103A, 103B, 103C and 103D. The remaining third insulation layer excluding the second openings 108 is referred to as a third insulation layer pattern 107A, hereafter.

Figure 3E:
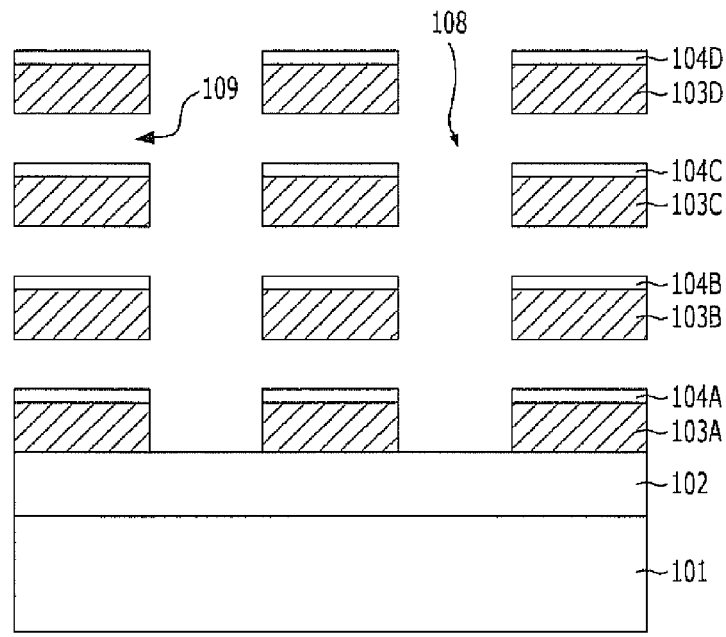
Figure 4E:
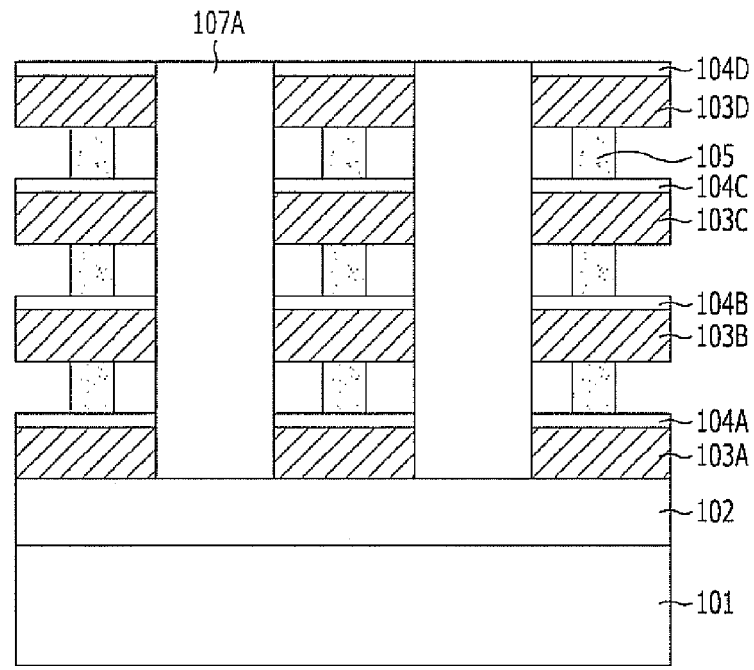

Referring to FIGS. 3E and 4E, the second insulation layers 105A, 105B and 105C exposed on the sidewalls of the second openings 108 are selectively removed. Since the second insulation layers 105A, 105B and 105C are nitride layers, they may be selectively removed through a wet etch process using phosphoric acid ($H_3PO_4$) without damage to the first insulation layers 104A, 104B, 104C and 104D and the gate electrodes 103A, 103B, 103C and 103D.

Since the second insulation layers 105A, 105B and 105C are removed, third openings 109 are formed between the gate electrodes 103A, 103B, 103C and 103D and the first insulation layers 104A, 104B, 104C and 104D. The third openings 109 are referred to as an undercut. As a result, the third openings 109 are formed between the multiple gate electrodes 103A, 103B, 103C and 103D that are stacked in the vertical direction.

When the third openings 109 are formed, a photoresist pattern may be formed to prevent the multiple gate electrodes 103A, 103B, 103C and 103D from collapsing. For example, the line-type photoresist layer pattern that has been used during the formation of the second openings 108 is used or a photoresist layer pattern having a wider linewidth is used. With the photoresist layer pattern, a portion of each second insulation layer remains to function as a supporter (refer to a reference numeral '105' of FIG. 4E) that supports the gate electrodes.

Figure 3F:
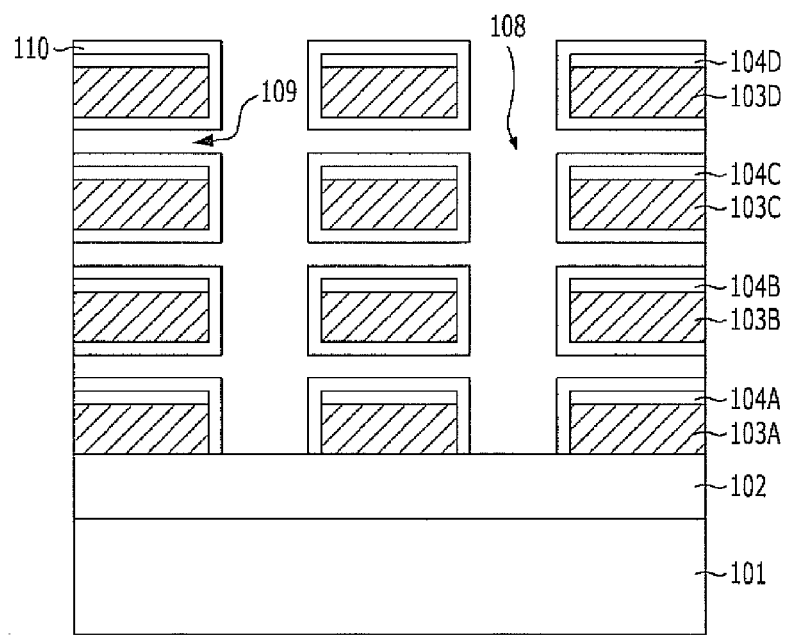
Figure 4F:
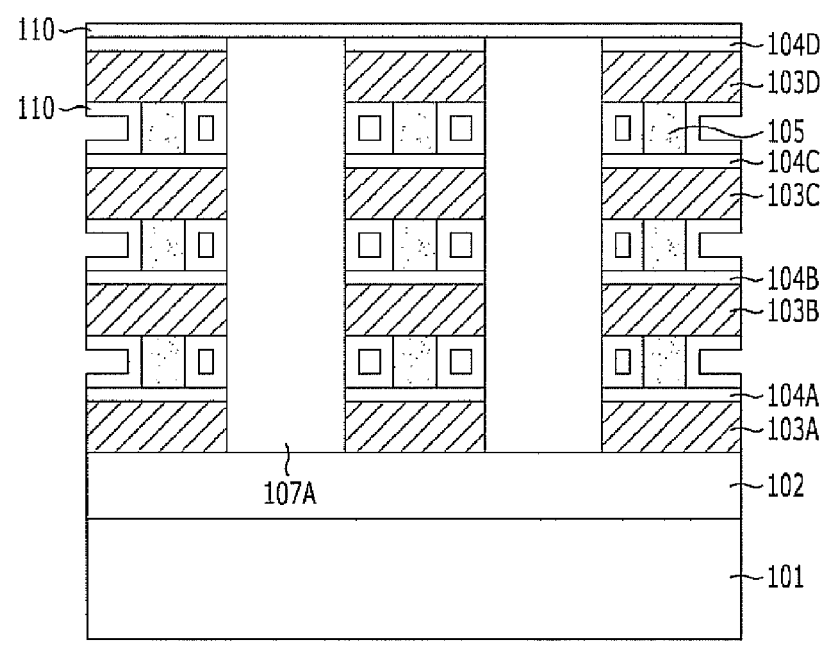

Referring to FIGS. 3F and 4F, a charge trapping dielectric layer 110 is formed over the substrate structure including the second openings 108. The charge trapping dielectric layer 110 includes a gate insulation layer, a charge trapping layer, and a tunnel insulation layer. In short, the gate insulation layer, the charge trapping layer, and the tunnel insulation layer are sequentially stacked. The tunnel insulation layer may have a thickness of approximately 1 Å to approximately 200 Å. The upper insulation layer may have a thickness of approximately 1 Å to approximately 500 Å. The charge trapping layer may be a nitride layer. The charge trapping layer may have a thickness of approximately 1 Å to approximately 500 Å. The upper insulation layer may be formed of a silicon oxide. The upper insulation layer may be formed of a material having a greater dielectric constant than the silicon oxide. Metal material may be injected into the charge trapping layer as impurity/specks.

Figure 3G:
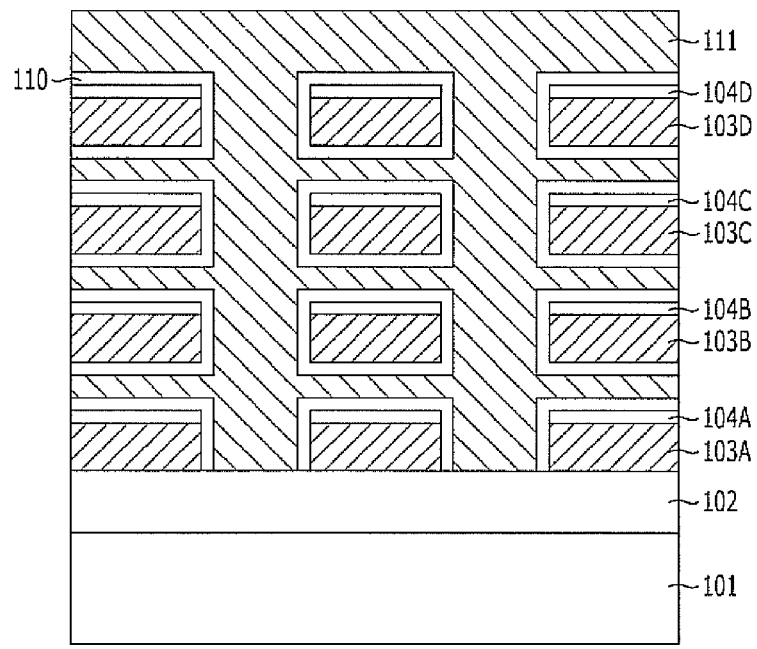
Figure 4G:
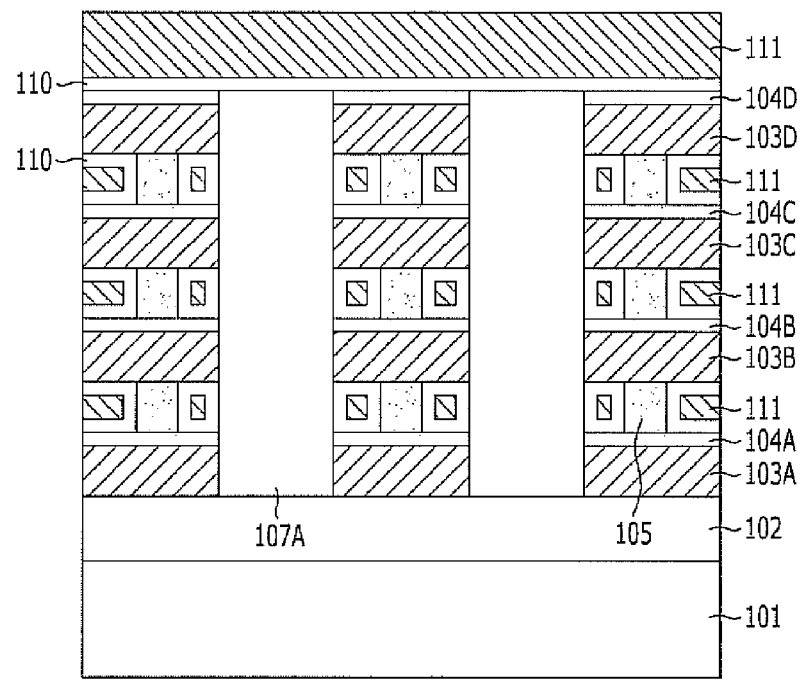

Referring to FIGS. 3G and 4G, a second conductive layer 111 filling the second openings 108 and the third openings 109 is formed over the charge trapping dielectric layer 110. The second conductive layer 111 may be formed to have a predetermined thickness over the uppermost layer of the stack layer. The second conductive layer 111 is a material that is used as channels and source/drains of a memory cell.

The second conductive layer 111 may be polysilicon layer. The second conductive layer 111 may be formed of a conductive layer, other than silicon. Also, the second conductive layer 111 may be formed by denaturing a non-conductive material into a conductive material by implanting an impurity into the non-conductive material. Also, the second conductive layer 111 may be formed of metal.

According to a first fabrication method, the second conductive layer 111 is formed of an undoped polysilicon.

Figure 3H:
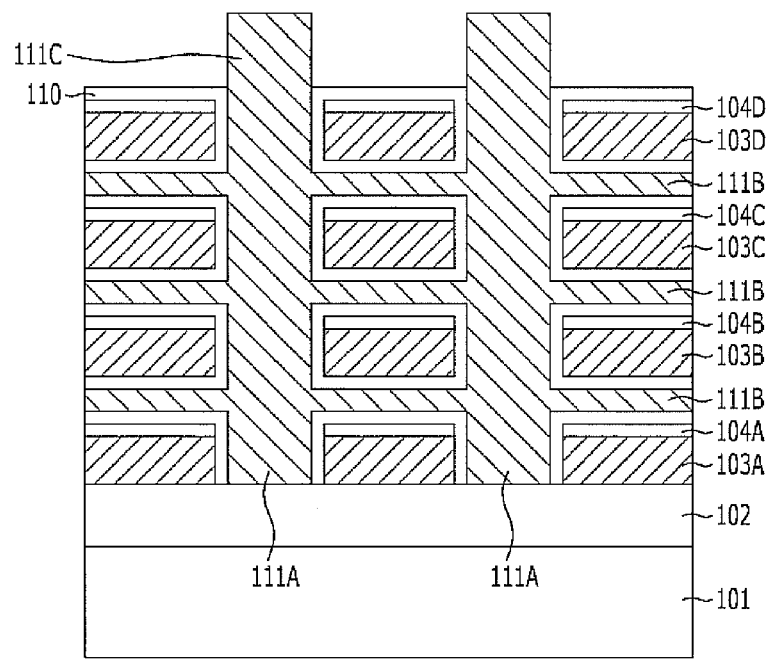
Figure 4H:
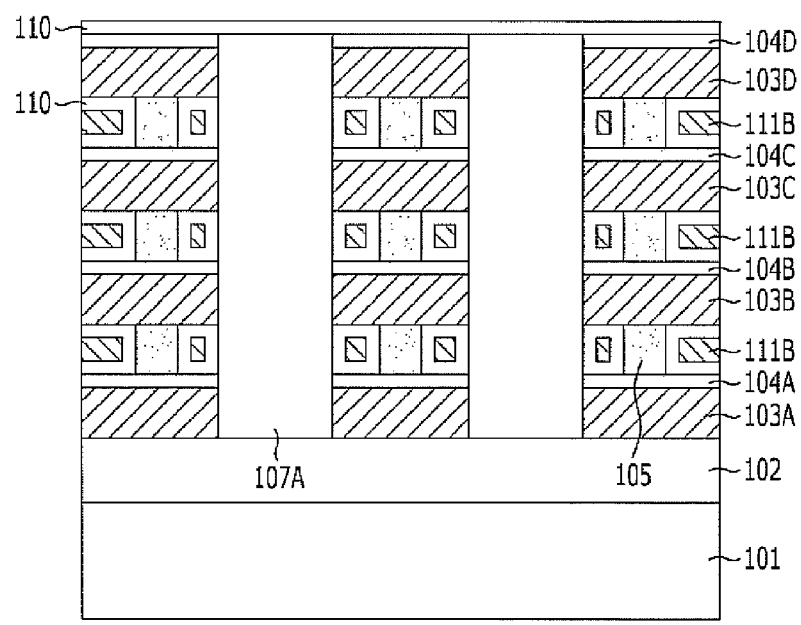

Referring to FIGS. 3H and 4H, the second conductive layer 111 is selectively etched. As a result, the second conductive layer remaining inside the second openings becomes junction layers 111A, and the second conductive layer remaining inside the third openings between the gate electrodes becomes a cell channel layer 111B. The upper portion of the second conductive layer remains as the form of pillars, and the pillar-shaped upper portion becomes the channels 111C of selection transistors.

Figure 5A:
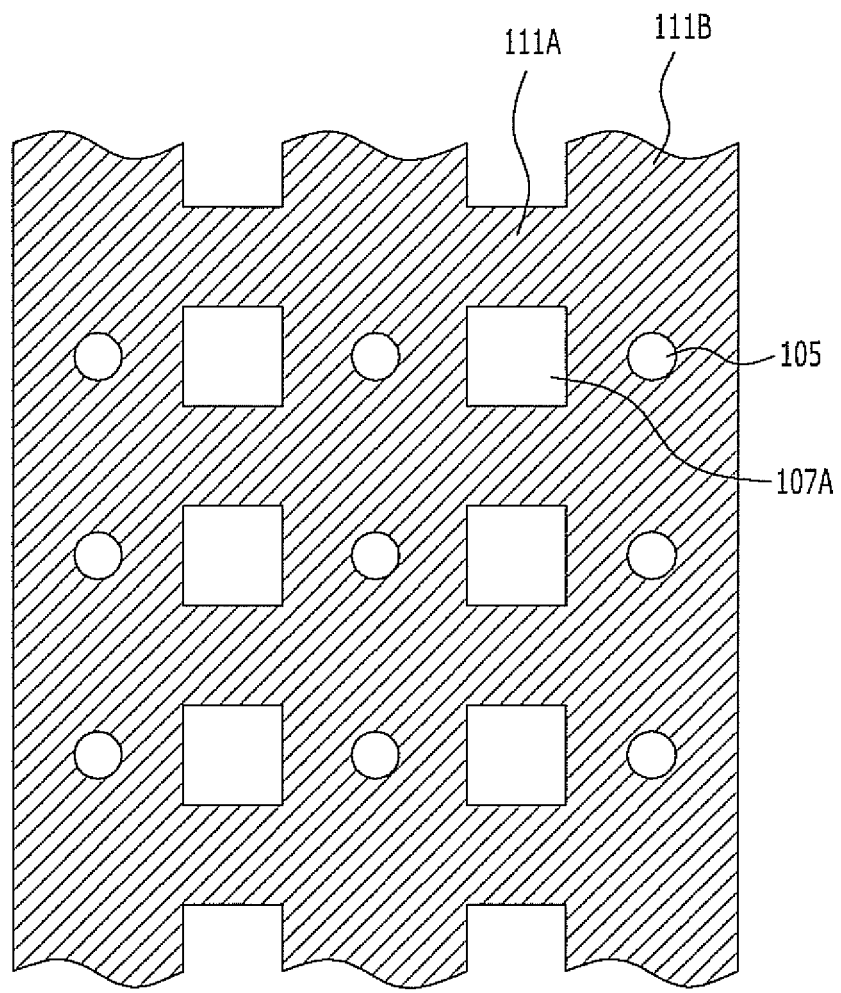
FIG. 5A is a plan view illustrating a structure including junction layers and cell channel layers in accordance with the first embodiment of the present invention.

FIG. 5A is a plan view illustrating a structure including junction layers and cell channel layers in accordance with the first embodiment of the present invention. Here, the junction layers 111A and the cell channel layers 111B are coupled with each other. The cell channel layers 111B are penetrated by pillars, i.e., the second insulation layer 105, and the third insulation layer pattern 107A remains between the junction layers 111A. For the purpose of the description, the charge trapping dielectric layer 110 around the second insulation layer 105 and the third insulation layer pattern 107A is omitted from the FIG. 5A.

Figure 5B:
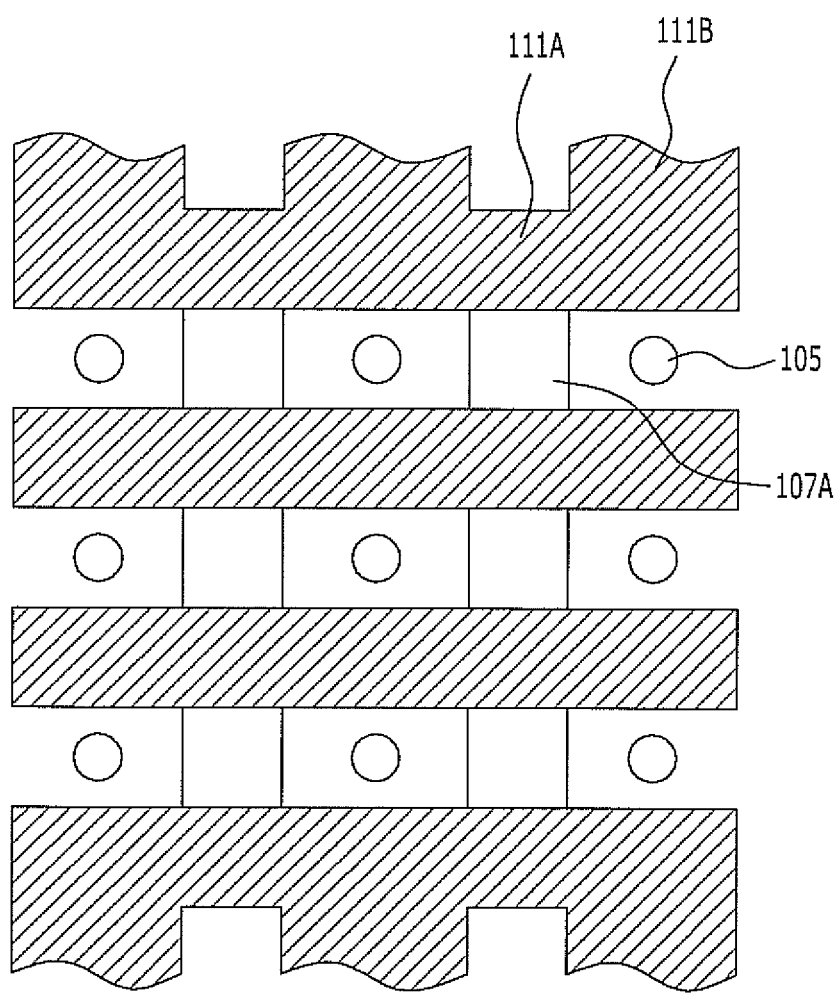
FIG. 5B is a plan view illustrating a modified example of the structure including junction layers and cell channel layers in accordance with the first embodiment of the present invention.

FIG. 5B is a plan view illustrating a modified example of the structure including junction layers and cell channel layers in accordance with the first embodiment of the present invention. Here, the junction layers 111A and the cell channel layers 111B are coupled with each other. The cell channel layers 111B formed on the lines where the second insulation layer 105 and the third insulation layer pattern 107A are formed (i.e., in the B-B' direction) are removed.

Figure 3I:
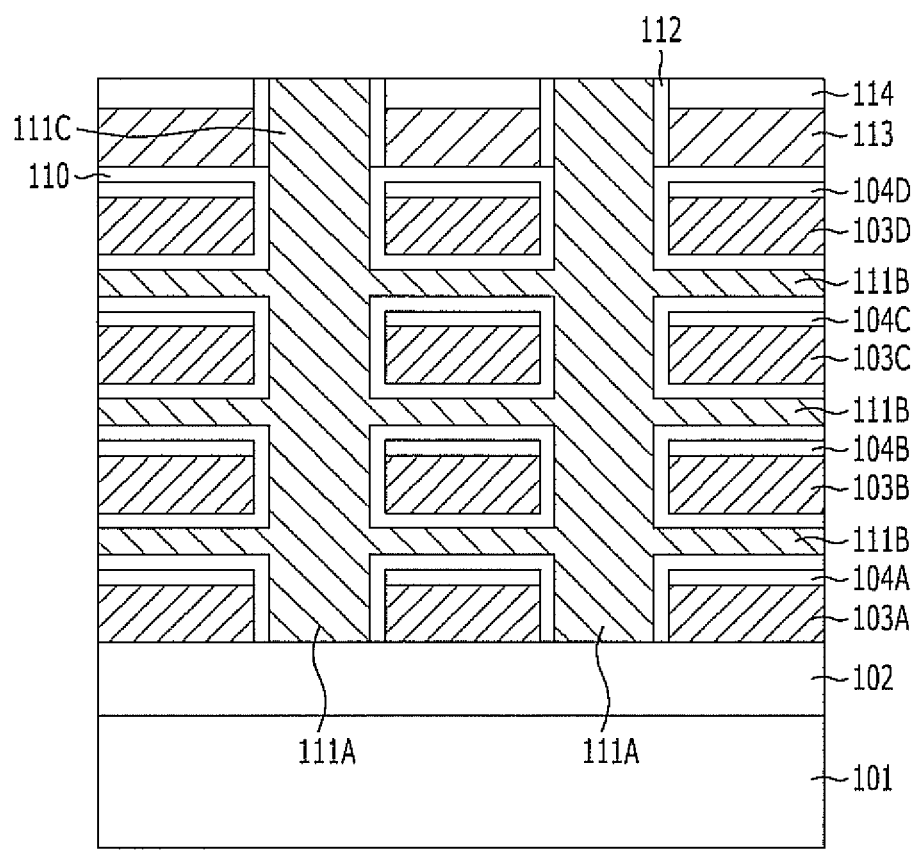

Referring to FIG. 3I, selection transistors are formed to select a string of memory cells having a vertical structure. Each selection transistor includes a selection gate 113 and a gate insulation layer 112. In other words, the gate insulation layer 112 surrounding the channels 111C is formed, and then the selection gates 113 are formed. A third insulation layer 114 for inter-layer insulation is formed over each selection gate 113.

Figure 3J:
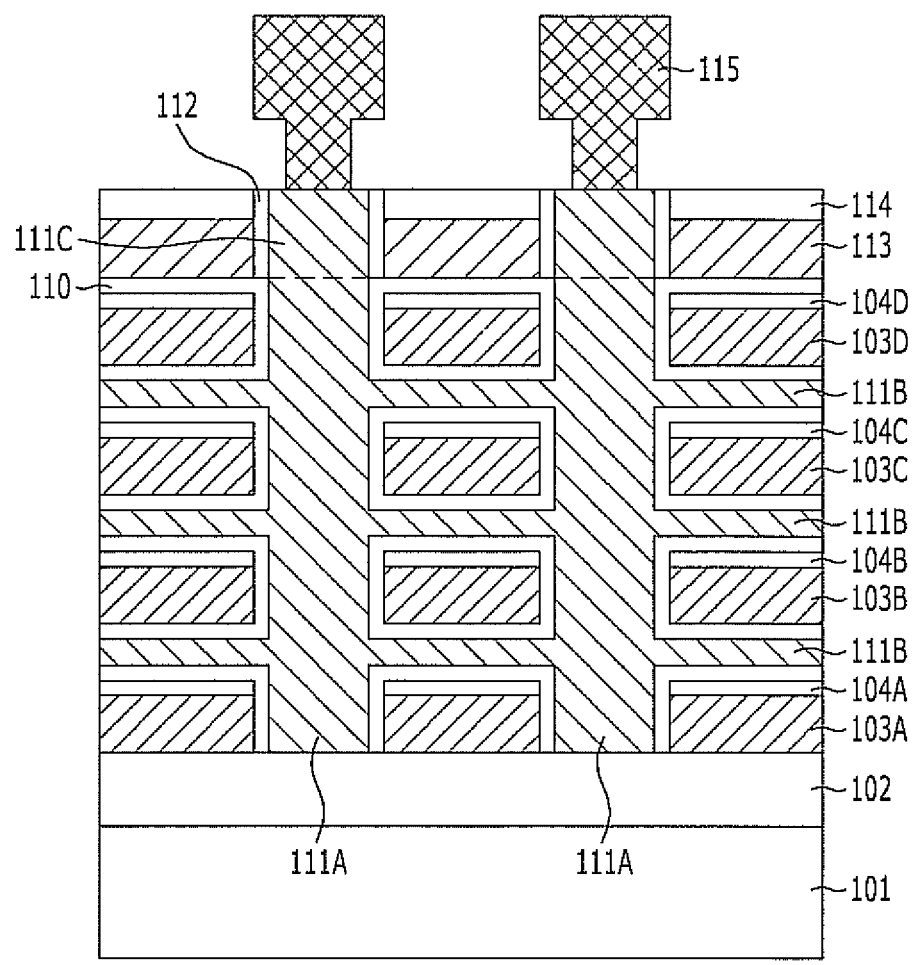

Referring to FIG. 3J, bit lines 115 for applying a current and a voltage are formed over the channels 111A.

Meanwhile, the selection transistors and the bit lines are not formed in the B-B' direction.

Figure 6:
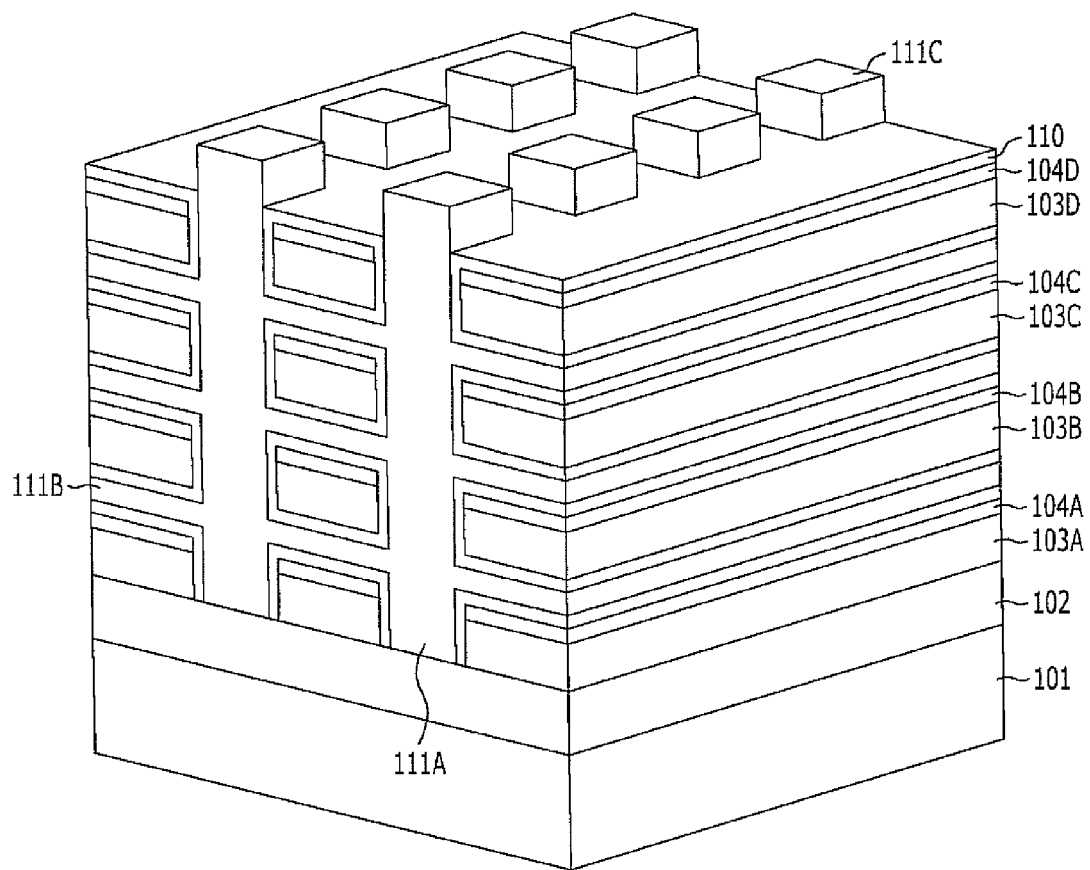
FIGS. 6 and 7 are perspective views illustrating a non-volatile memory device in accordance with the first embodiment of the present invention.
Figure 7:
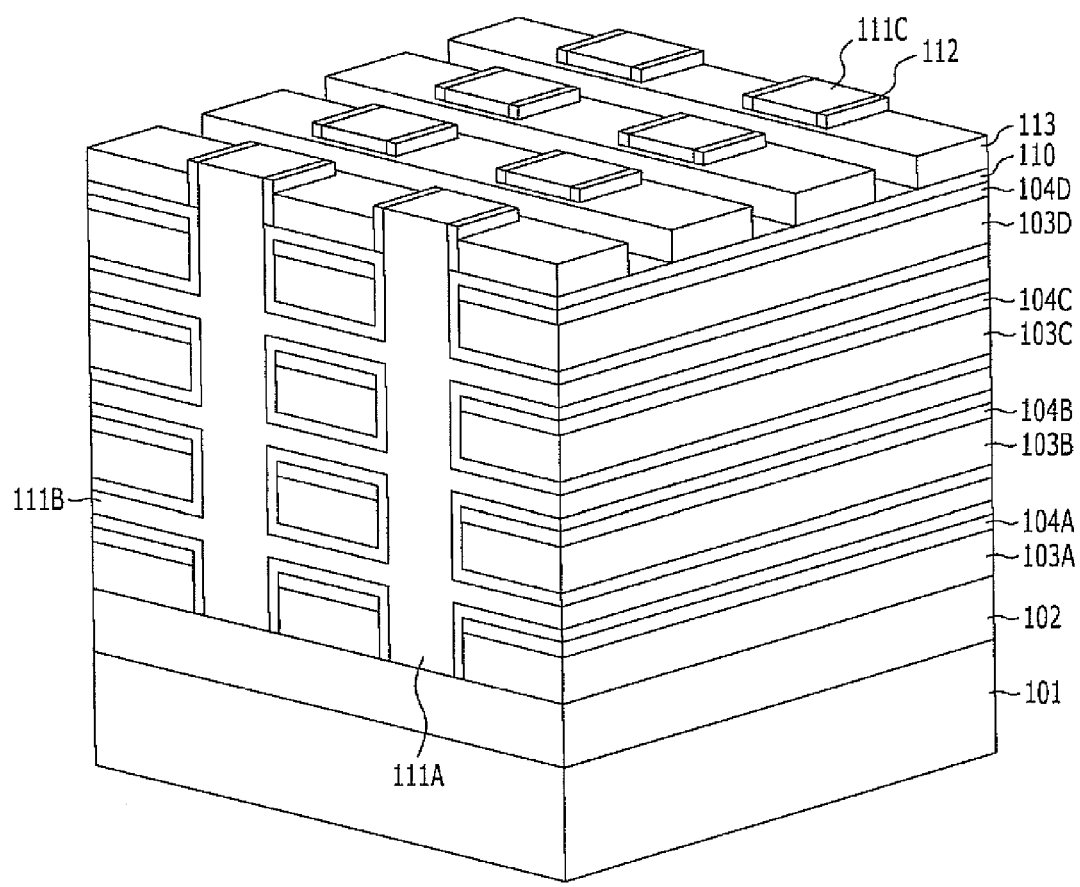

FIGS. 6 and 7 are perspective views illustrating a non-volatile memory device in accordance with the first embodiment of the present invention. FIG. 6 shows a resultant substrate structure after the junction layers 111A and the cell channel layers 111B are formed, and FIG. 7 shows a resultant substrate structure after the selection transistors are formed.

Referring to FIGS. 6 and 7, the buffer layer 102 is formed over the semiconductor substrate 101, and the junction layers 111A having a shape of pillars stretched in the vertical direction are formed over the buffer layer 102. The cell channel layers 111B and the gate electrodes 103A, 103B, 103C and 103D are alternately stacked in multiple times. The charge trapping dielectric layer 110 is formed between the gate electrodes 103A, 103B, 103C and 103D and the cell channel layers 111B. The charge trapping dielectric layer 110 surrounds the gate electrodes 103A, 103B, 103C and 103D. The cell channel layers 111B and the junction layers 111A are integrated with each other. The channels 111C of the selection transistors are formed in the upper portions of the junction layers 111A. The gate electrodes 103A, 103B, 103C and 103D have a shape of plane stretched in the first direction, and the junction layers 111A have a shape of pillars stretched in the second direction crossing the gate electrodes 103A, 103B, 103C and 103D, i.e., in the vertical direction. The selection gates 113 of the selection transistors are stretched in a third direction crossing the junction layers 111A and the gate electrodes 103A, 103B, 103C and 103D.

FIGS. 8A to 8E are cross-sectional views illustrating a method for fabricating a non-volatile memory device in accordance with a second embodiment of the present invention. The processes until the charge trapping dielectric layer is formed are the same as the first embodiment of the present invention.

Figure 8A:
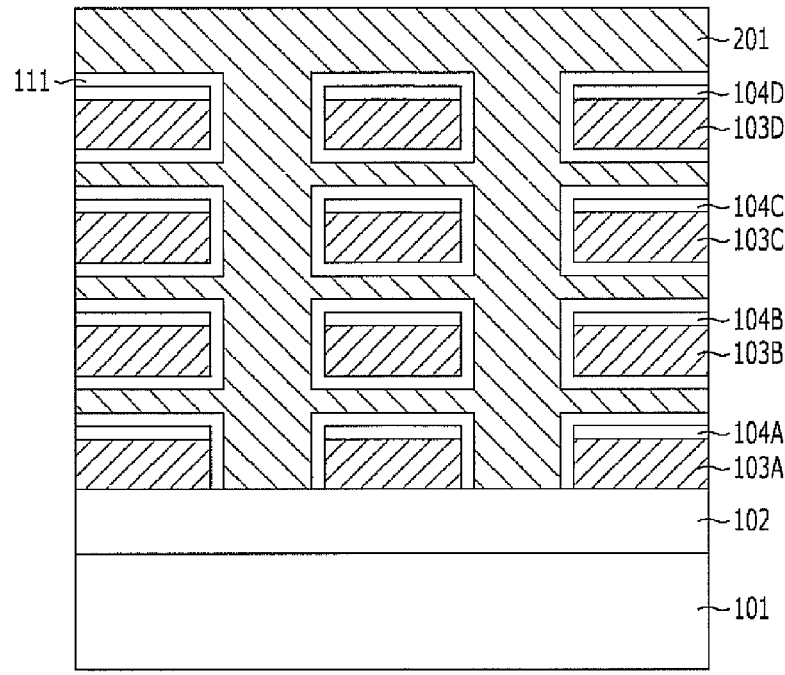
FIGS. 8A to 8E are cross-sectional views illustrating a method for fabricating a non-volatile memory device in accordance with a second embodiment of the present invention.

Referring to FIG. 8A, a charge trapping dielectric layer 110 is formed through the process illustrated in FIGS. 3A to 3F.

Subsequently, a second conductive layer 201 is formed over the charge trapping dielectric layer 110 to fill second openings and third openings. The second conductive layer 201 may be formed to have a predetermined thickness over the uppermost layer of the stack layer. The second conductive layer 201 is used as cell channels of a memory cell.

The second conductive layer 201 may be a polysilicon layer. For example, the second conductive layer 201 may be a polysilicon layer doped with an N-type impurity or a P-type impurity.

Figure 8B:
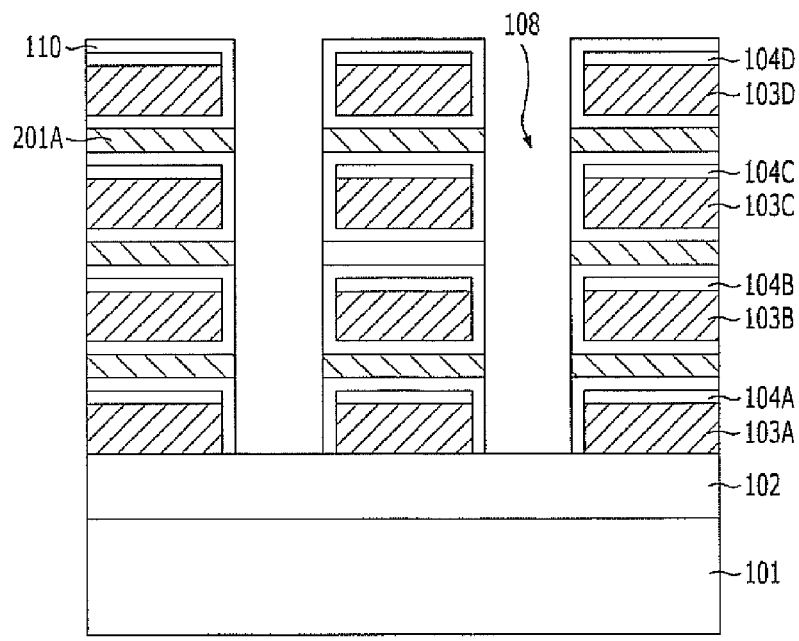

Referring to FIG. 8B, the second conductive layer inside the second openings is selectively removed. As a result, a second conductive layer pattern 201A remains inside the third openings, and the second openings 108 are formed again. Hereafter, the second conductive layer pattern 201A becomes cell channel layers 201A.

Figure 8C:
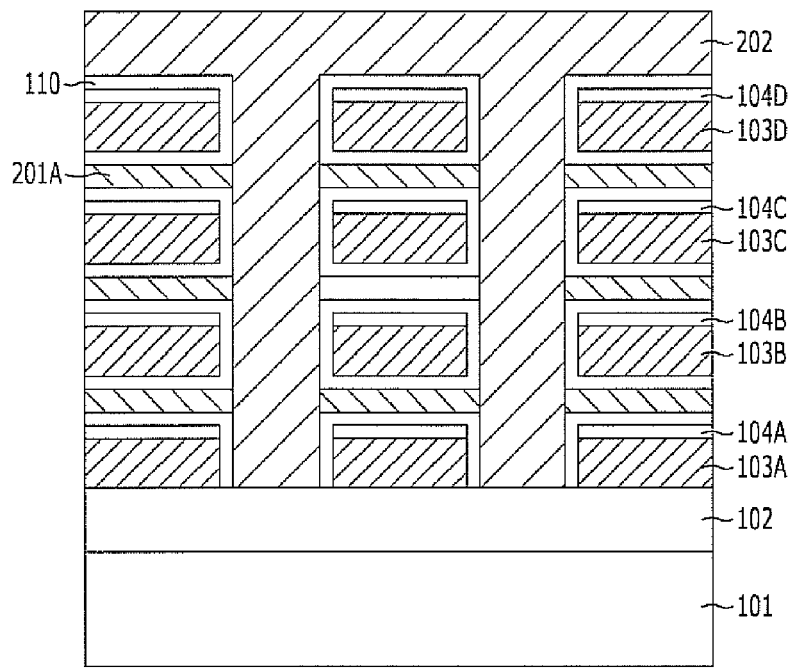

Referring to FIG. 8C, a third conductive layer 202 is formed to fill the second openings 108. The third conductive layer 202 may be a polysilicon layer. According to an embodiment of the present invention, the third conductive layer 202 may be a polysilicon layer doped with an impurity. When the cell channel layers 201A are polysilicon layers each doped with a P-type impurity, the third conductive layer 202 is formed to be a polysilicon layer doped with an N-type impurity. In short, the cell channel layers 201A and the third conductive layer 202 are formed to be the polysilicon layers but doped with impurities of opposite conductive types.

Figure 8D:
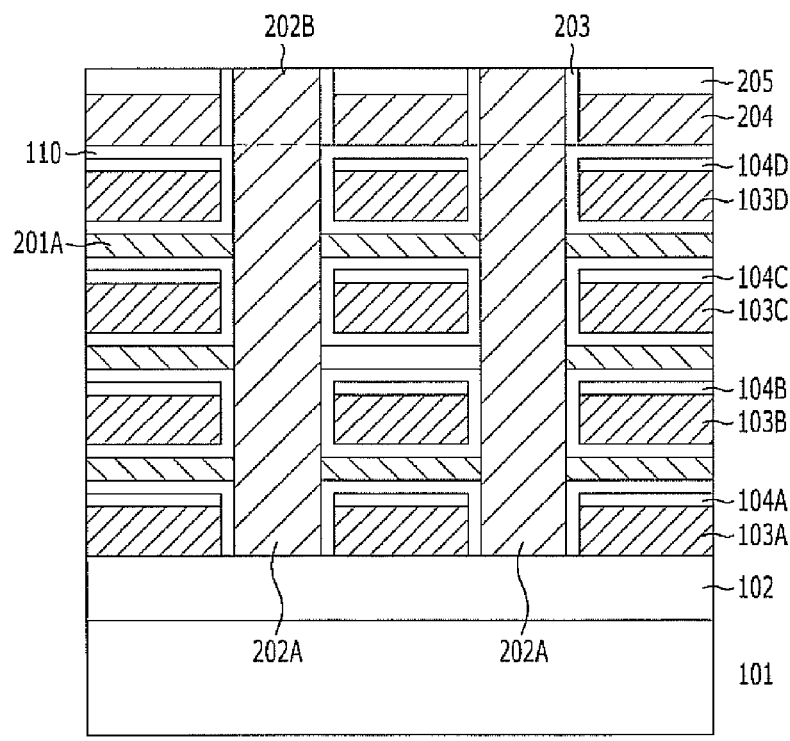

Referring to FIG. 8D, the third conductive layer 202 is selectively etched. As a result, junction layers 202A remaining inside the second openings is formed. The upper portion of the third conductive layer remains as the shape of pillars, which become the channels 202B of the selection transistors.

The junction layers 202A and the cell channel layers 201A are coupled with each other.

Figure 9:
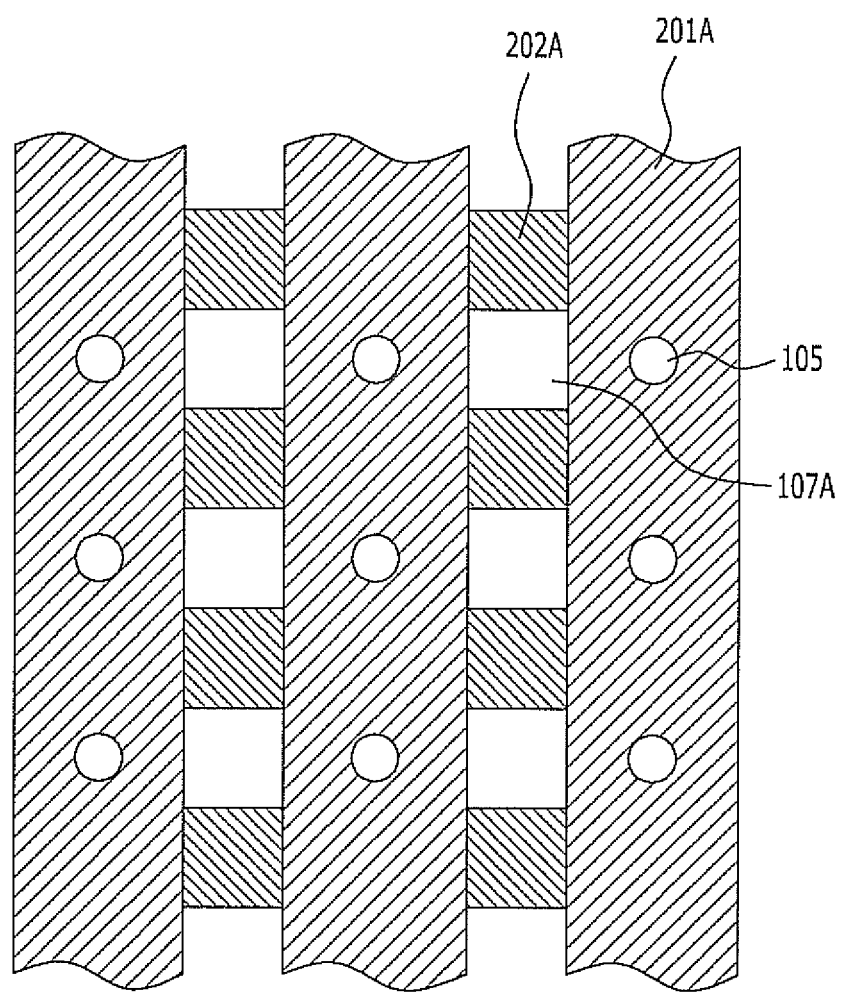
FIG. 9 is a plan view illustrating a structure including junction layers and cell channel layers in accordance with the second embodiment of the present invention.

FIG. 9 is a plan view illustrating a structure including the junction layers 202A and the cell channel layers 201A in accordance with the second embodiment of the present invention. The junction layers 202A and the cell channel layers 201A are coupled with each other. The cell channel layers 201A are penetrated by pillars, i.e., the second insulation layer 105, and a third insulation layer pattern 107A remains between the junction layers 202A.

Subsequently, selection transistors are formed to select a string of memory cells having a vertical structure. Each selection transistor includes a selection gate 204 and a gate insulation layer 203. In other words, the gate insulation layer 203 surrounding the channels 202B is formed, and then the selection gates 204 are formed. A third insulation layer 205 for inter-layer insulation is formed over each selection gate 204.

Figure 8E:
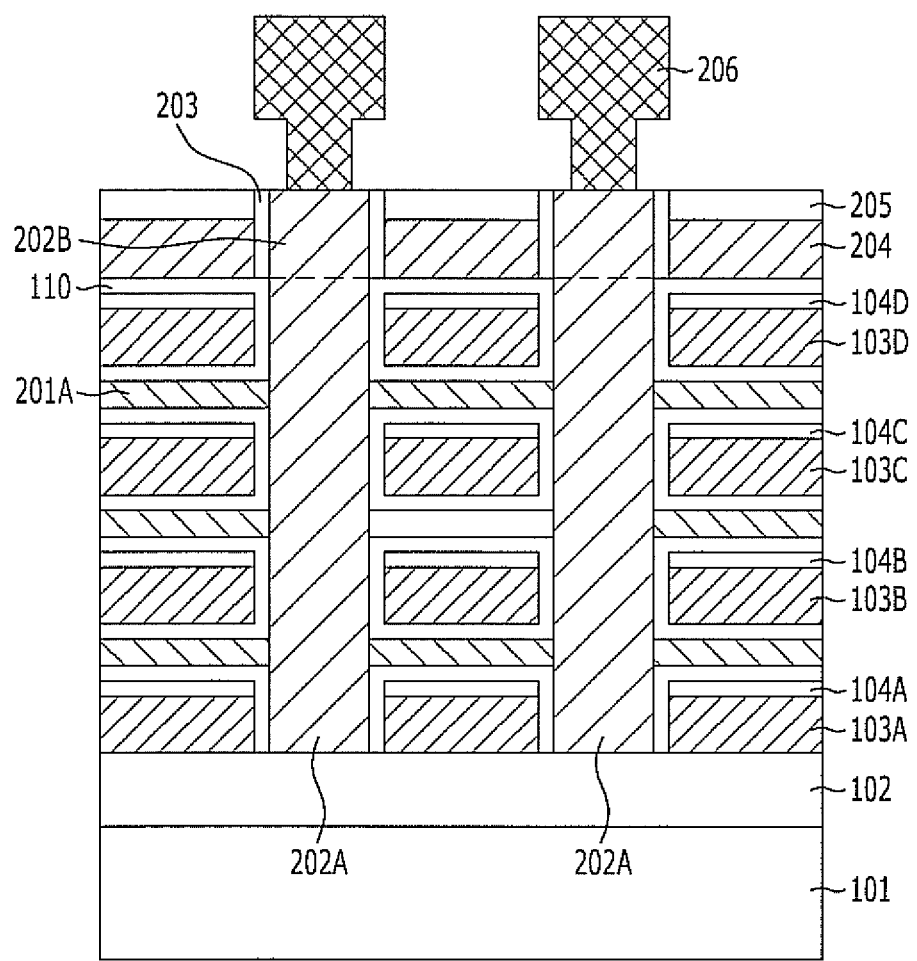

Referring to FIG. 8E, bit lines 206 for applying a current and a voltage are formed over the junction layers 202A.

Figure 10:
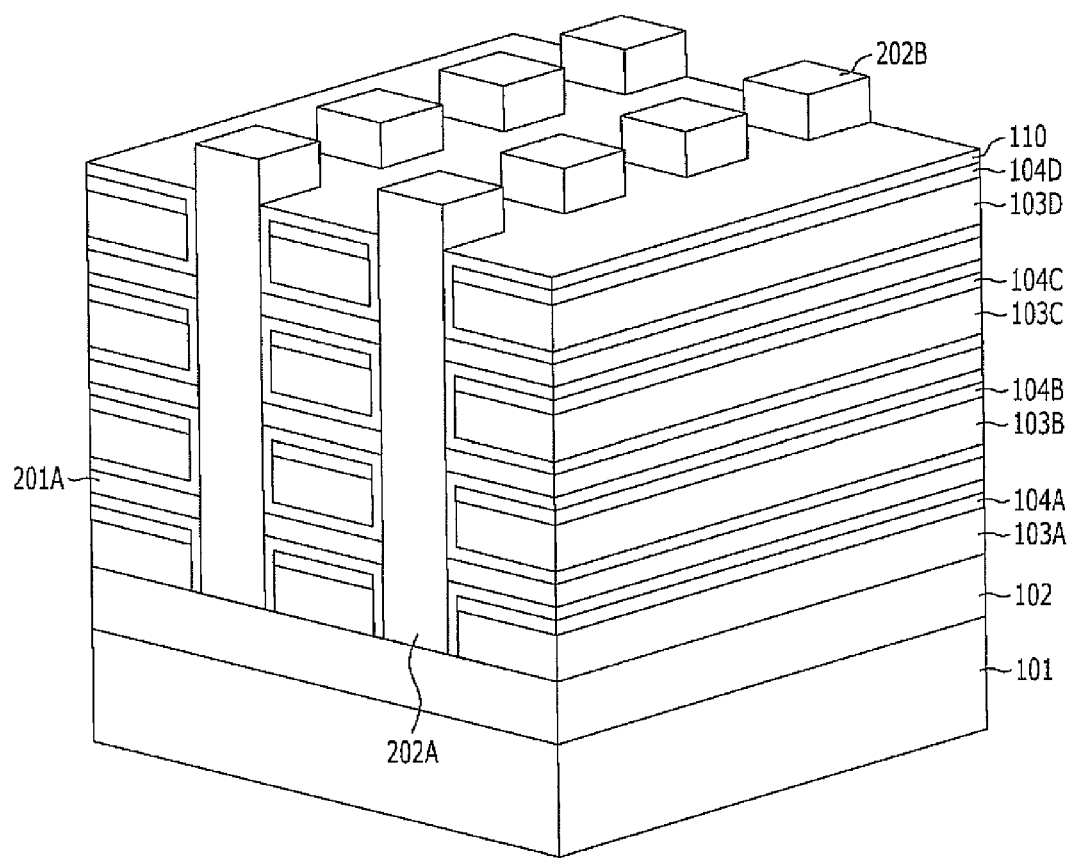
FIGS. 10 and 11 are perspective views illustrating a non-volatile memory device in accordance with the second embodiment of the present invention.
Figure 11:
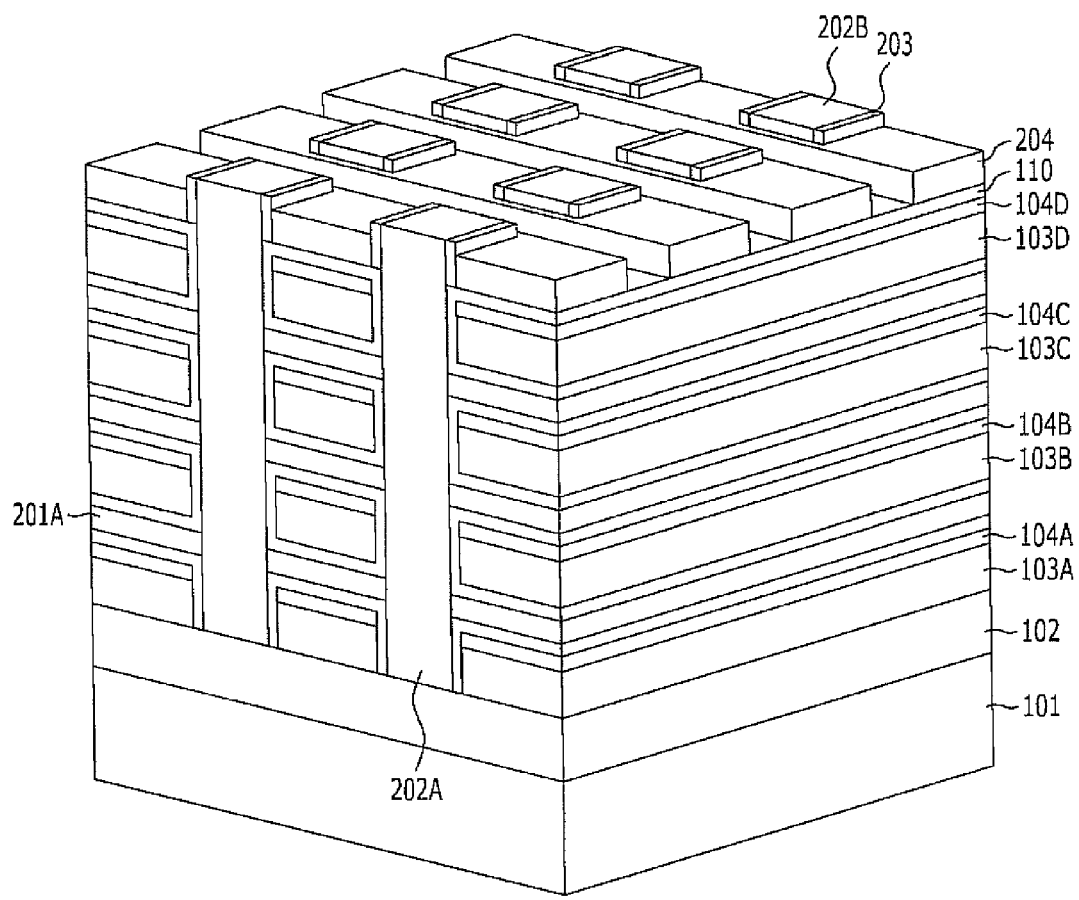

FIGS. 10 and 11 are perspective views illustrating a non-volatile memory device in accordance with the second embodiment of the present invention. FIG. 10 shows a resultant substrate structure after the junction layers 202A and the cell channel layers 201A are formed, and FIG. 11 shows a resultant substrate structure after the selection transistors are formed.

Referring to FIGS. 10 and 11, the buffer layer 102 is formed over the semiconductor substrate 101, and the junction layers 202A having a shape of pillars stretched in the vertical direction are formed over the buffer layer 102. The cell channel layers 201A and the gate electrodes 103A, 103B, 103C and 103D are alternately stacked in multiple times. A charge trapping dielectric layer 110 is formed between the gate electrodes 103A, 103B, 103C and 103D and the cell channel layers 201A. The charge trapping dielectric layer 110 surrounds the gate electrodes 103A, 103B, 103C and 103D. The cell channel layers 201A and the junction layers 202A are integrated with each other. The channels 202B of the selection transistors are formed in the upper portions of the junction layers 202A. The gate electrodes 103A, 103B, 103C and 103D have a shape of plane stretched in the first direction, and the junction layers 202A have a shape of pillars stretched in the second direction crossing the gate electrodes 103A, 103B, 103C and 103D, i.e., in the vertical direction. The selection gates 204 of the selection transistors are stretched in a third direction crossing the junction layers 202A and the gate electrodes 103A, 103B, 103C and 103D.

According to the above described embodiments of the present invention, the density of memory cells formed in a unit area of a semiconductor substrate may be increased more than two times. The increase in the memory density is obtained by controlling the number of the first insulation layers and the second insulation layers that are stacked. Also, since the gate electrodes are coupled with the channels except the space for the deposition of a gate material, resistance becomes low and the time delay caused by the gate loading effect may be minimized.

According to another embodiment of the present invention, as an unit device formed over a semiconductor substrate, NOR cells may be formed in a vertical structure, instead of a structure where memory cells are formed as a single layer, and also vertical memory cells of a Dynamic Random Access Memory (DRAM) device may be formed in the same method.

According to an embodiment of the present invention, the memory density may be substantially increased regardless of the area of a silicon substrate and patterning limitation.

In addition, since memory integration rate may be increased by increasing the number of the memory gates, the production cost may be greatly decreased.

While the present invention has been described with respect to the specific embodiments, it will be apparent to those skilled in the art that various changes and modifications may be made without departing from the spirit and scope of the invention as defined in the following claims.

What is claimed is:
1. A method for fabricating a non-volatile memory device, comprising:

forming a stack layer by alternately stacking a first conductive layer, a first insulation layer, and a second insulation layer over a semiconductor substrate;

forming first openings and a plurality of gate electrodes that are isolated from each other by the first openings by etching the stack layer;

forming a third insulation layer filling the first openings;

forming second openings by selectively etching the third insulation layer;

forming third openings by removing the second insulation layer that is exposed on sidewalls of the second openings;

forming a charge trapping dielectric layer over the semiconductor substrate having the third openings formed therein; and forming a junction layer and a cell channel layer over the charge trapping dielectric layer to fill the second openings and the third openings, respectively.

2. The method of claim 1, further comprising:

forming a channel layer by selectively etching an upper portion of the junction layer;

forming a selection gate of a selection transistor surrounding the channel layer; and forming a bit line coupled with the channel layer.

3. The method of claim 1, wherein the charge trapping dielectric layer is formed by stacking a gate insulation layer, a charge trapping layer, and a tunnel insulation layer.

4. The method of claim 1, wherein the second openings are formed as holes of circular or polygonal shapes.

5. The method of claim 1, the forming of the junction layer and the cell channel layer comprises:

forming a second conductive layer filling the second openings and the third openings over the charge trapping dielectric layer;

forming the cell channel layer filling the third openings by removing the second conductive layer filling the second openings; and forming the junction layer by forming a third conductive layer filling the second openings.

6. The method of claim 5, wherein the second conductive layer and the third conductive layer comprise polysilicon layers doped with respective impurities having opposite conductive types.

7. The method of claim 1, wherein, in the forming of the third openings, the second insulation layer is removed to remain as a shape of a pillar.

8. The method of claim 7, wherein, in the forming of the cell channel layer, the cell channel layer is filled in the third openings and formed as a shape of a plane penetrated by the pillar.

* * * * *